United States Patent
Jeong et al.

[11] Patent Number: 6,063,455
[45] Date of Patent: May 16, 2000

[54] APPARATUS FOR MANUFACTURING DIAMOND FILM HAVING A LARGE AREA AND METHOD THEREOF

[75] Inventors: Hyo Soo Jeong, Seoul; Han Kim, Kyonggi-Do; Jung Ok Choi, Seoul; Moung Jae Kim, Kyonggi-Do, all of Rep. of Korea

[73] Assignee: Institute for Advanced Engineering, Seoul, Rep. of Korea

[21] Appl. No.: 08/731,059

[22] Filed: Oct. 9, 1996

[30] Foreign Application Priority Data

| Oct. 9, 1995 | [KR] | Rep. of Korea | 95-34472 |
| Dec. 28, 1995 | [KR] | Rep. of Korea | 95-61823 |
| Dec. 28, 1995 | [KR] | Rep. of Korea | 95-61827 |

[51] Int. Cl.[7] .................................................. C23C 14/00
[52] U.S. Cl. ........................ 427/596; 427/249; 118/726; 118/730
[58] Field of Search .................................. 118/726, 730, 118/729; 427/596, 249

[56] References Cited

U.S. PATENT DOCUMENTS

| 4,987,007 | 1/1991 | Wagel | 427/596 |
| 5,622,567 | 4/1997 | Kojima | 427/596 |
| 5,693,146 | 12/1997 | Nakanishi | 118/726 |

FOREIGN PATENT DOCUMENTS

| 1-184277 | 7/1989 | Japan | 118/730 |

OTHER PUBLICATIONS

Marquardt, Mat. Res. Soc. Symp. Proc., vol. 38, pp. 325–335, 1985.

*Primary Examiner*—Richard Bueker
*Attorney, Agent, or Firm*—Bryan Cave LLP

[57] ABSTRACT

The present invention relates to an apparatus for manufacturing a diamond film having a large area which is used for a field emission display (FED) and a manufacturing method thereof.

The apparatus for manufacturing a diamond film having a large area according to the present invention comprises a pulse laser generating system for generating a pulse laser beam, a laser beam scanner for scanning said pulse laser beam, and a vacuum chamber which includes a target and a substrate holder, wherein said laser beam having passed said laser beam scanner is irradiated on said target, and wherein a substrate on which a diamond film is to be formed by a plume produced from said target is set up to said substrate holder. The diamond film according to the present invention has a uniform electrical and mechanical properties and can be obtained in a short time period and with a uniform width and a large area. The diamond film manufactured according to the present invention can be also used for manufacturing emitters for FED having a large area and can increase the efficiency of the target because of the possibility of using the overall area thereof.

5 Claims, 4 Drawing Sheets

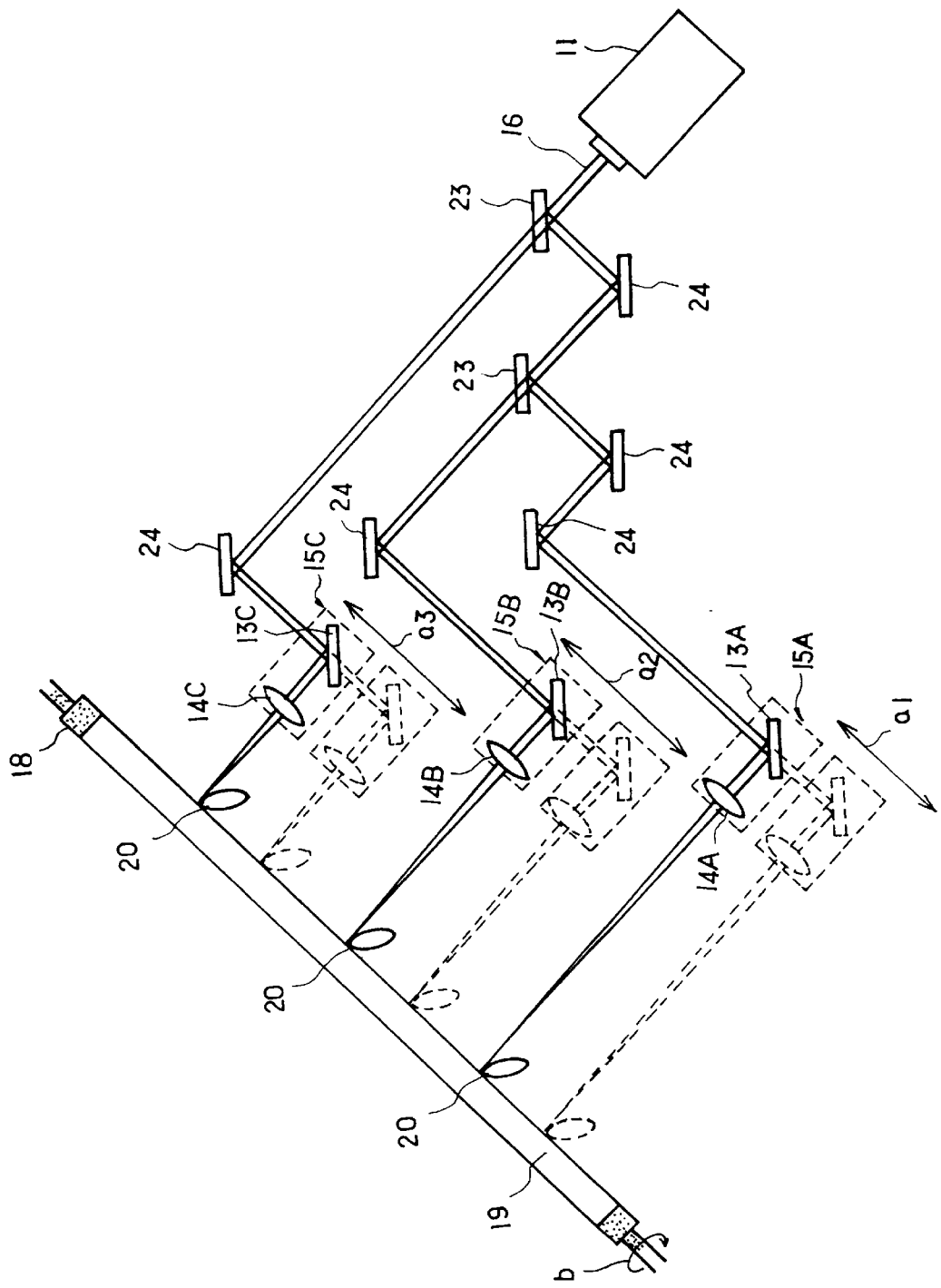

APPARATUS FOR MANUFACTURING DIAMOND FILM HAVING A LARGE AREA AND METHOD THEREOF

FIELD OF THE INVENTION

The present invention relates to an apparatus for manufacturing a diamond film having a large area which is used for a field emission display (FED) and a manufacturing method thereof. More particularly, the present invention relates to an apparatus for obtaining a large area diamond film having a uniform electron emission property and w a uniform mechanical property, by scanning a focused pulse laser beam on a target and thus by forming a plume which moves linearly on the target and thereafter by depositing a portion of the plume to a substrate, and a manufacturing method thereof.

BACKGROUND OF THE INVENTION

Generally, pure diamond is represented as a bonding structure of $sp^3$ and has an insulating property. However, pure graphite is represented as a bonding structure of $sp^2$ and has a conductive property because of having delocalized electrons.

In a diamond film of the present invention which will be described in detail herein below, the bonding structure among carbon atoms may be a pure hybrid combination of $sp^3$ or a mixed combination of $sp^2$, $sp^1$, etc. Unlike natural diamond, the fine structure of the diamond film of the present invention may be a polycrystal or an amorphous structure, or a complex structure mixed with a polycrystal and an amorphous structures.

In addition, diamond of the present invention may be composed only of pure carbon atoms, or may be composed of carbon atoms as a main component and impurity atoms such as a metal or a metalloid, etc.

A diamond film which will be described in the present invention covers all of hard carbon, diamond-like carbon, amorphous diamond and nanocrystalline diamond film, etc., without distinguishing from one to another. Further, a diamond film which will be described in the present invention has a meaning of a solid state material which is solidified from a vapor state. A diamond film of the present invention can be used as a good-qualified material for forming an emitter of FED, because it shows a high electron emission property even at a low electric field.

Methods, in prior arts, such as HFCVD (Hot Filament Chemical Vapor Deposition), MPCVD (Microwave Plasma Chemical Vapor Deposition), PECVD (Plasma Enhanced Chemical Vapor Deposition), sputtering, and PLD (Pulse Laser Deposition), etc. have been used forobtaining a diamond film. However, in order to obtain a good-qualified diamond film by using HFCVD or MPCVD method, it is essentially required that the temperature of a substrate must be kept at about from hundreds to 1000° C. Thus, if a material such as glass the melting point of which is below the temperature range required above is used, the use of HFCVD or MPCVD method is difficult. Additionally, a process of HFCVD or MPCVD method is performed at a relatively high temperature, and thus, such a method is not effective in a processing time and an energy efficiency if a diamond film needs to be produced in a large scale.

PECVD method may be available for manufacturing an amorphous diamond film at a room temperature. However, a film manufactured by this PECVD method has a high residual stress and thus there is a disadvantage that a delamination between a substrate and a film may be vulnerable to occurrence depending on a material of the substrate.

Also, a high frequency sputtering method may be used for manufacturing a diamond film at a room temperature. However, in a diamond film manufactured by this sputtering method, it is difficult to obtain a good-qualified diamond film having a preferable electron emission property, compared with the PECVD method.

In addition, a deposition method for manufacturing a diamond film by using a prior art PLD method is described in detail in an article entitled "Deposition of Amorphous Carbon Films from Laser-Produced Plasmas" by C. L. Marquardt, et al., Naval Research Laboratory, Mat. Res. Soc. Symp. Proc. Vol. 38, pp325–335, which was published in 1985. An apparatus for performing this deposition method for manufacturing a diamond film by using a pulse laser can be simply constructed. A good-qualified and excellent film having a high fraction of $sp^3$ bonding of diamond is possibly manufactured at a room temperature by controlling a power density of laser being irradiated to a target over about $5 \times 10^{10}$ watt/cm$^2$. The power density is equal to a value of energy density per pulse being divided by a pulse width of a pulse laser, while the energy density is value of energy per pulse being devided by a cross-sectional area of laser beams on a target.

However, the PLD method has many limitations in utilization because this method is difficult to manufacture a film having a large area, compared with other methods described above. That is, if a laser having a high energy density is irradiated on a surface of a target being set up in a vacuum, a plume being a mixture of materials such as ions, atoms, molecules, and electrons, etc., which are also constituent components of the target, is formed and expanded to ward a substrate. A vapor material formed by a conventional evaporation method has a distribution which varies depending on cos ($\theta$) ($\theta$ is an angle relative to a normal direction of the target). However, because a plume formed by the PLD method has a distribution which varies depending on cos $n(\theta)(8<n<12)$, the plume is mainly formed at a limited area around a normal direction of the target which is contacted to the laser beam and thus a film is formed over a small area on the substrate.

That is, when a thin-film is formed on a position of a substrate by solidifying a plume, there exists a problem that the thickness of the thin-film is sharply decreased as the position of the substrate where the plume is to be solidified is placed far apart from a position of where the plume is produced. There exists another problem that when a target made of an alloy composed of various components is used, the thin-film does not have a constant composition in proportion to the constitutional components depending on a position of the target.

In U.S. Pat. No. 4,987,007, granted to S. S. Wagel, et al., in 1991, an apparatus for depositing a diamond film and a manufacturing method thereof are disclosed in detail where carbon ions are extracted from a plasma plume by setting up an ion separation mechanism which includes an accelerating grid electrode, capable of charging and discharging, to a known PLD apparatus. However, the method disclosed in U.S. Pat. No. 4,987,007 above forms only one laser plume and the position on which the plume is to be formed is fixed. Thus, it is difficult to make a film having a large area of more than tens of inches, considering the angular distribution of the laser plume described above.

As a result, it is extremely difficult to manufacture a film having a uniform thickness, composition in constitutional components and a uniform electrical and a mechanical properties, and having a width of more than one inch, if the film is manufactured by the known PLD method which forms only one plume on a fixed position of the target.

SUMMARY OF THE INVENTION

The present invention has an object to provide an apparatus for manufacturing a diamond film and a method thereof without the problems in known apparatuses for depositing a diamond film and in known methods thereof described above. In an apparatus for manufacturing a diamond film and a method thereof according to the present invention, one or more plumes are formed by irradiating one or more laser beams to a moving target which is set up to a portion of an internal in a vacuum chamber after passing the one or more laser beams to one or more laser beam scanners capable of a round movement. A large area diamond film is manufactured by depositing the formed one or more plumes on a moving substrate which is set up to another portion of the internal in the vacuum chamber.

In order to accomplish the object above, an apparatus for manufacturing a diamond film according to the present invention comprises a pulse laser generating system for generating a pulse laser beam, one or more laser beam scanners for scanning the pulse laser beam, a target for forming one or more plumes by the laser beam which passes the one or more laser beam scanners, a substrate onto which a portion of the plume is deposited for forming a film, and a vacuum chamber including a target holder and a substrate holder for holding the target and the substrate respectively.

Also, a method for manufacturing a large area diamond film using the manufacturing apparatus above according to the present invention comprises the following steps: producing a pulse laser beam from a pulse laser generating system, making the laser beam to be linearly round moved and to be focused after changing a path of the laser beam by a laser beam scanner, forming a plume by irradiating the linearly round moving and focused laser beam on a moving target which is set up in a portion of a vacuum chamber, and forming a film by depositing the plume on a substrate which is set up in another portion of the vacuum chamber.

BRIEF DESCRIPTION OF THE DRAWINGS

The present invention will be better understood from reading the following description of non-limitative embodiments, with reference to the attached drawings, wherein below:

FIG. 3 is an outlined view of a multiple laser beam scanning system for forming a plurality of plumes being linearly round moved on a target by forming a plurality of laser beams which are linearly round moved simultaneously, a plurality of beam splitters, and a plurality of beam scanners according to the present invention.

DETAILED DESCRIPTION OF THE INVENTION

Figure 1:
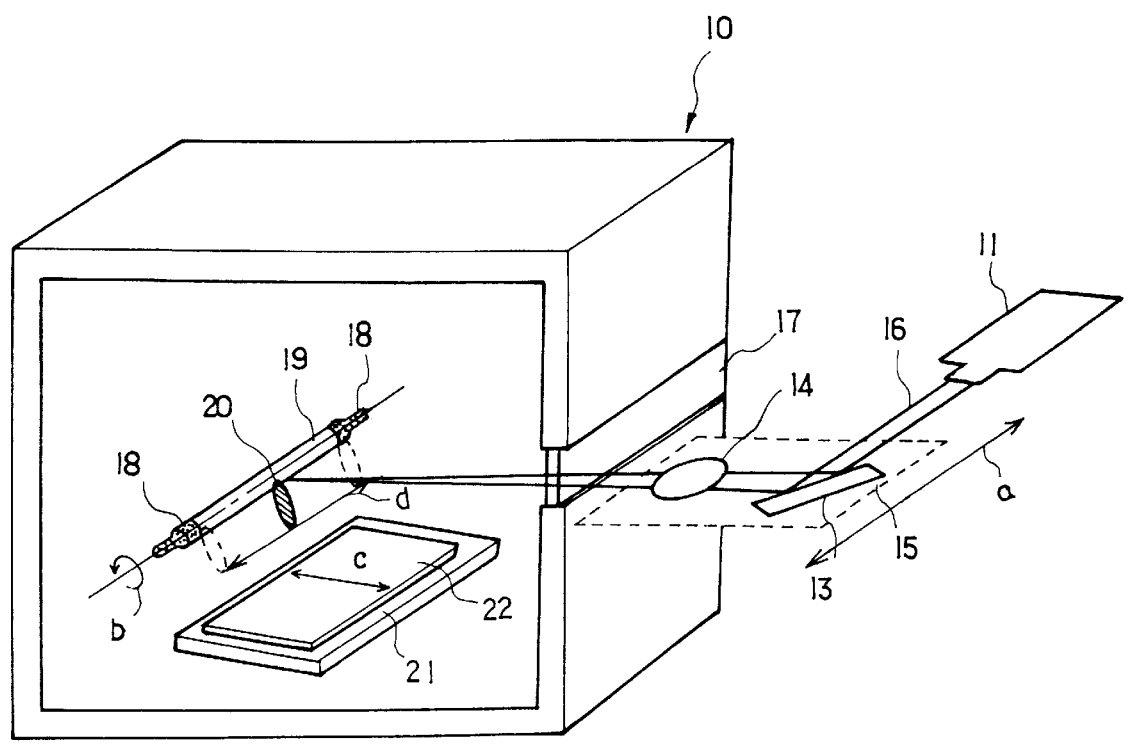
FIG. 1 is a perspective view of an apparatus for manufacturing a diamond film having a large area according to the present invention.

FIG. 1 shows an apparatus for manufacturing a diamond film having a large area using a pulse laser according to the persent invention. In the manufacturing apparatus according to the present invention, a pulse laser generating system 11 generates a pulse laser beam 16. A laser beam scanner comprising a mirror 13, a focusing lens 14 and a motion controller 15 scans the pulse laser beam 16. After passing the laser beam scanner, the pulse laser beam 16 irradiates on a target 19 which is held to a target holder 18. A substrate up in a vacuum chamber 10 in order to hold substrate 22 on which a film is to be formed.

More specifically, the mirror 13 is so arranged that the pulse laser beam 16 generated from the pulse laser generating system 11 may fall on the surface of the mirror 13 with an angle of incidence of 45° and an angle of reflection of 45° respectively, relative to the normal direction of the mirror surface. That is, the mirror 13 functions to change the path of the pulse laser beam 16 by 90°. The focusing lens 14 which is set up on a top portion of the motion controller 15 is also separately set up with a constant distance from the mirror 13 and functions to increase the energy density of the pulse laser beam by focusing the pulse laser beam which is reflected by the mirror 13.

Thus, the target 19 must be set up to be located within a depth of focus of the focusing lens 14 in order to be irradiated with highest energy density of the pulse laser beam 16 which is irradiated on the target 19 being set up in a portion of an internal of the vacuum chamber 10. The focusing lens 14 may comprises a plurality of lenses rather than one lens in order to control the focal length of lens and lens aberration. The focusing lens 14 basically functions to increase the energy density of the incident pulse laser beam 16.

The motion controller 15 including the mirror 13 and the focusing lens 14 moves linearly round, and the moving speed and the moving distance thereof are precisely controlled by a computer system.

As a result of linearly round movement of the motion controller 15 in the direction of (a) as shown in FIG. 1, the focused pulse laser beam 16 being linearly round moved in the direction of (d) as shown in FIG. 1 on the target 19 can be obtained.

Next, the pulse laser beam 16 which passes the laser beam scanner reaches the vacuum chamber 10. The vacuum chamber 10 comprises an optical window 17, a target holder 18, a target 19, a substrate holder 21 and a substrate 22. The optical window 17 which is set up to a side wall of the vacuum chamber 10 functions to pass the pulse laser beam 16 into the vacuum chamber 10. The optical window 17 is made of BK7 glass quartz, etc., which has a relatively high transmittance. Also, the target holder 18 for holding the target 19 is set up in a portion of the internal of the vacuum chamber 10. The substrate holder 21 for holding the substrate 22 is set up in a position separated by a desired distance from the target 19. The target holder 18 can hold a cylindrical and rod-like target 19. The target 19 can rotate about an axis of longitudinal direction of the cylindrical and rod-like target 19, e. g., in the direction of (b) as shown in FIG. 1. The rotation of the target 19 prevents the pulse laser beam 16 from being irradiated on a fixed target and thus from eroding the fixed target locally. In this case, the pulse laser beam 16 which is irradiated into the internal of the vacuum chamber 10 by the laser beam scanner moves linearly round on the surface of the rotating target 19. The pulse laser beam 16 is irradiated on the surface of the target 19 with a high energy density and thus interacts with the material comprising the target 19. The material produced by the interaction above is a laser plume 20 composed of materials such as ions, molecules, atoms and electrons, etc., of the target with a high kinetic energy. The pulse laser beam 16 moves linearly round on the target 16 and as a result the plume 20 also moves linearly round.

If setting up a moving substrate perpendicularly to a moving direction of the linearly round moving plume 20 and oppositely to the linearly round moving plume 20, the plume 20 can be solidified rapidly over a large area of the substrate 22, which resultingly leads to form a film. That is, a film having a uniform thickness and a large area is formed by solidifying the linearly round moving plume 20 on a top portion of the substrate which is moved linearly or linearly round in a vertical direction relative to the moving direction of the plume.

A preferred example in respect of the moving type of the substrate is that the substrate stops during a period that the laser plume moves from one end to the other end of the substrate and is solidified on the substrate, and before the laser plume starts to move again in a reverse direction, the substrate moves so that the laser plume is solidified on a new surface of the substrate by moving the substrate by a desired distance in a vertical direction to relative the moving direction of the plume.

In this case, if the target material is made of graphite, a good-qualified diamond film having a large area can be obtained. An apparatus for manufacturing a lager area diamond film by using the moving type above is very suitable especially in application to an in-line deposition process.

Figure 2:
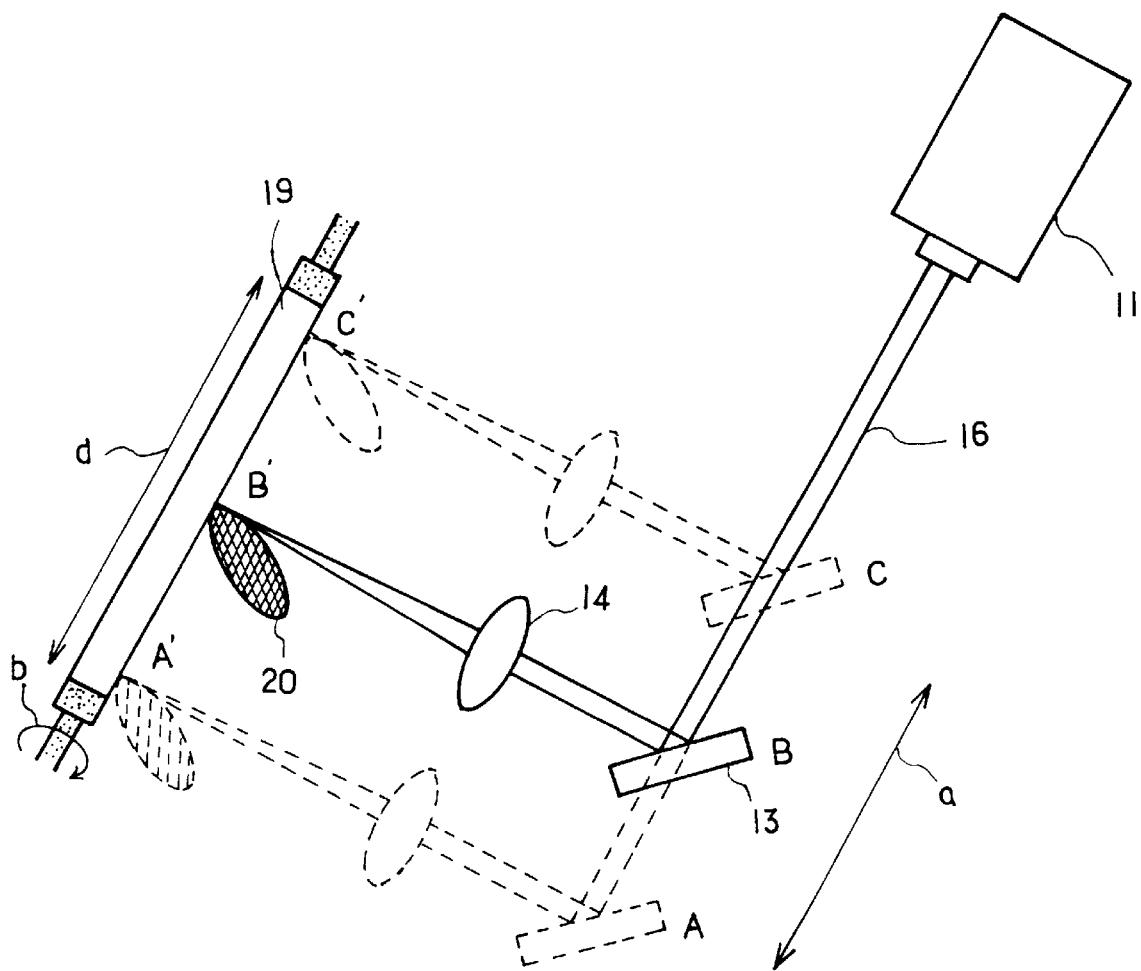
FIG. 2 is an outlined view which shows an operating principle of a laser beam scanner for forming a linearly round moving plume on a target by forming a linearly round moving laser beam according to the present invention.

FIG. 2 shows in more detail the operating principle and the function of the laser beam scanner. The moving direction and the moving speed depending on the moving distance and the position of the mirror 13 and the focusing lens 14 which are set up on the motion controller (not shown) are precisely controlled by the motion controller.

The mirror 13 changes the path of the pulse laser beam 16 and moves in order to make the pulse laser beam 16 to be scanned continuously from one end to the other of the surface of the target 19. In a preferred example of moving type of the mirror 13, the mirror 13 changes the path of the pulse laser beam 16 only by a constant angle and simultaneously moves linearly in a straight line with a constant speed. The path of the pulse laser beam 16 is changed by 90° by controlling the incident angle of the pulse laser beam 16 to be 45°. The important thing in case of using the moving mirror 13 is that the energy density of the pulse laser beam 16 irradiated on the surface of the target 19 should be kept constant by maintaining a constant distance between the surface of the target 19 and the focusing lens 14.

In a preferred embodiment of the present invention, the motion controller is designed to arrange the moving path thereof and the target 19 in parallel in order to maintain a constant distance therebetween. Thus, the distance between the mirror 13 and the focusing lens 14 and the target 19 is always maintained constant and as a result the energy density on the target 19 is also always maintained constant even though the pulse laser beam 16 moves continuously over from one end to the other of the target 19.

If the mirror 13 is located at position A as shown in FIG. 2, the plume 20 is formed at position A' on the target 19. If the mirror 13 is located at B position by a linear movement thereof, then the plume 20 is formed at position B'. If the mirror 13 is located at position C due to a continuous movement thereof, the plume 20 is formed at position C'. That is, if the mirror 13 continuously moves by a linearly round movement with a sequence of A→B→C→B→A, the position of the plume 20 to be formed on the target 19 also moves by a linearly round movement with a sequence of A'→B'→C'→B'→A' and thus the plume 20 being moved on the target 19 is obtained.

FIG. 3 shows a multiple laser beam scanning system for forming a plurality of plumes 20 being linearly round moved on a target 19 by forming a plurality of pulse laser beams 16 which are linearly round moved simultaneously between one end and the other of the target 19, a plurality of beam splitters 23 and a plurality of beam scanners according to the present invention. A laser beam generated from a pulse laser system 11 is split into two pulse laser beams by a beam splitter 23 which is located in the path of the pulse laser beam. One of the split pulse laser beams 16 is reflected by a mirror 24 and is again split into two pulse laser beams by another beam splitter 23 which is located in the path of the reflected pulse laser beam. In this case, if using N beam splitters, the initial pulse laser beam can be split into N+1 pulse laser beams. The split pulse laser beams which have passed the beam splitters 23 are changed in their paths by the mirrors 24 located in the paths of the split pulse laser beams and thereafter fall on the respective beam scanners. The respective pulse laser beams which are fallen on the respective beam scanners form a plurality of plumes 20 on the target 19 which is held to a target holder 18 being set up in the vacuum chamber 10 as shown in FIG. 1. By solidifying a plurality of the plumes 20 which are moving linearly round, a fast deposition of a diamond film over a large area can be possibly obtained by moving the substrate 22 in the direction of (c), as shown in FIG. 1, which is perpendicular relative to the moving direction of the respective plumes 20. The focal lengths of the respective focusing lenses 14A, 14B, and 14C which are set up on the responding laser beam scanners are selected respectively to have the same energy density for the respective pulse laser beams which are focused on the target 19, in order to achieve the object of the present invention.

It is possible to get a higher energy density of the laser beams if in the laser beam scanners, a plurality of means for expanding the pulse laser beam such as beam expanders or collimators, etc., are set up in the paths of the pulse laser beams between the mirrors 13A, 13B, and 13C and the focusing lenses 14A, 14B, and 14C, or between the pulse laser generating system 11 and the mirrors 13A, 13B, and 13C. That is, when the expanded laser beams which are expanded by the beam expanders, etc., are focused on the target 19 by the focusing lenses 14A, 14B, and 14C, the size of the laser beams can be smaller so that the energy density of the laser beams irradiated on the target 19 may be increased. Of course, if the diameter of the laser beam is increased, the aperture size of the respective mirrors 13A, 13B, and 13C and the respective focusing lenses 14A, 14B, and 14C should also be increased. A higher energy density of the laser beams can enhance formation of a good-qualified diamond film.

In addition, during the depositing process for a diamond film by using the laser beam scanning method, the deposition rate essentially depends on the repetition rate of the pulse laser and thus a higher deposition rate can be obtained as the pulse laser operates in a higher repetition rate. Therefore, it is desirable to use a pulse laser generating system capable of providing a higher output energy and a higher repetition rate, in order to deposit a good-qualified diamond film at a very high deposition rate.

Figure 4A:
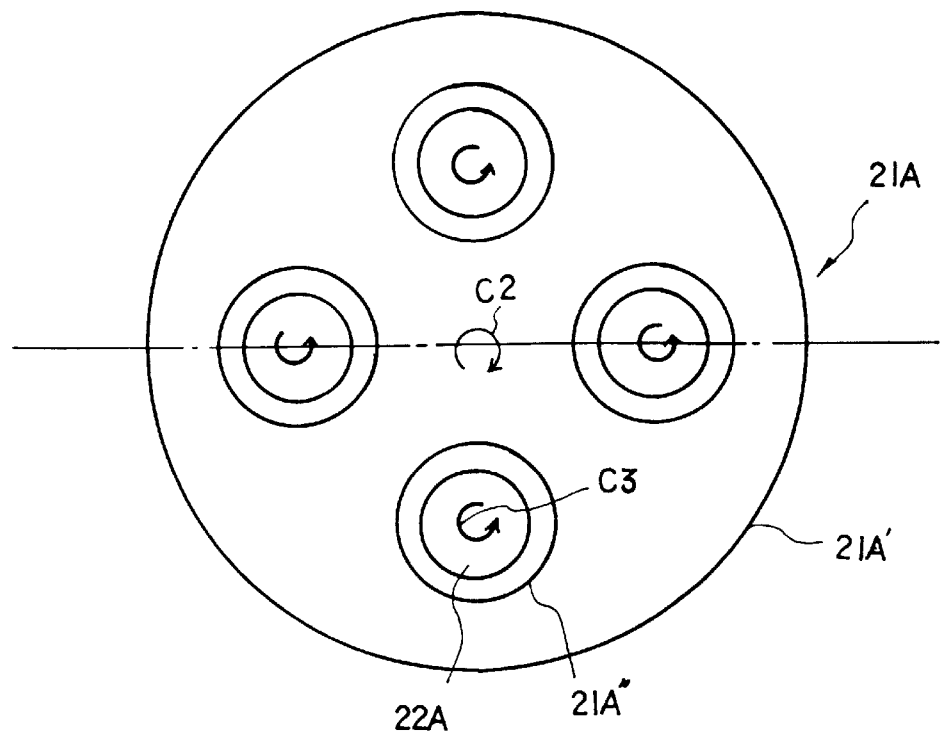
FIG. 4A is a top view of another embodiment of a substrate holder and a substrate being set up thereto according to the present invention.
Figure 4B:
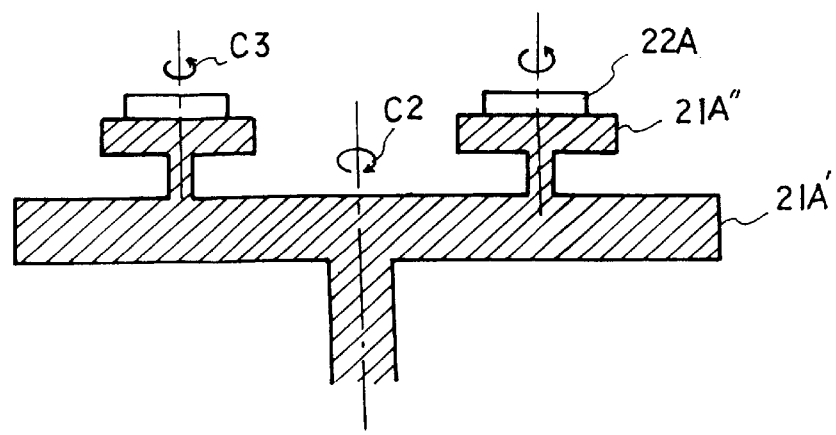
FIG. 4B is a cross-sectional view of the substrate being set up to the substrate holder as shown in FIG. 4A.

FIGS. 4A and 4B show a substrate holder 21A and a substrate 22A, capable of rotation and revolution, which are applicable to the apparatus for manufacturing a diamond film having a large area according to the present invention described above. The substrate holder 21A comprises a lower plate 21A' thereof being rotated in a direction of c2 as shown in FIGS. 4A and 4B and an upper plate 21A" thereof being rotated in a reverse direction c3 relative to the c2 direction. The rotating axis of the lower plate 21A' is separated a constant distance from the rotating axis of the upper plate 21A". The substrate 22A set up on the upper plate 21A" rotates about the axis of the upper plate 21A" and simultaneously revolves about the axis of the lower plate 21A'. In a preferred embodiment of the present invention as shown in FIG. 4A, four upper plates 21A" for holding four substrates 22A are shown.

A method for manufacturing a diamond film having a large area using the pulse laser will herein below described. A pulse laser beam is generated from the pulse laser generating system. The path of the gerenated pulse laser beam is changed by passing the pulse laser beam to the laser beam scanner. Thereafter, the pulse laser beam which moves linearly round is focused and irradiated into the internal of the vacuum chamber.

As a next step, the linearly round moving and focused pulse laser beam is irradiated on the moving target which is set up in a portion of the vacuum chamber, which resultingly leads to form a linearly round moving plume. After that, a diamond film having large area can be manufactured by depositing the plume on the substrate which is set up to the moving substrate holder which is also set up oppositely to the plume in another portion of the vacuum chamber.

Also, a method for depositing a large area film with a rapid speed on the substrate which moves linearly round, or rotates and revolves as described above, by setting up a plurality of beam splitters and a plurality of laser beam scanners between the pulse laser generating system and the vacuum chamber will be described herein below. A pulse laser beam is generated from the pulse laser generating system. The gerenated pulse laser beam is split into a plurality of pulse laser beams by a plurality of laser beam splitters located in the path of the generated pulse laser beam. Next, the path of the split pulse laser beams are changed by a plurality of mirrors which are also located in the paths of the split pulse laser beams. Thereafter, the split pulse laser beams pass through the responding laser beam scanners respectively and are focused. A plurality of the focused pulse laser beams move linearly round. Then, the focused pulse laser beams are irradiated on the moving target which is set up in the internal of the vacuum chamber and form a plurality of plumes which also move linearly round on the moving target. A plurality of the plumes can form a uniform film with a rapid speed over a large area of the substrate which is set up to another portion of the vacuum chamber and moves linearly round or rotates and revolves as well.

The diamond film manufactured by using the methods described above has a uniform electrical and mechanical properties. The diamond film described above can be obtained in a short time period and with a uniform width and a large area.

The diamond film manufactured by using the methods described above can be also used for manufacturing emitters for FED having a large area and can increase the efficiency of the target because of the possibility of using the overal area thereof.

What is claimed is:

1. An apparatus for manufacturing a diamond film having a large area comprising:

a pulse laser generating system for generating a pulse laser beam;

a beam expander for expanding a size of the pulse laser beam to increase a power density of the pulse laser beam;

a plurality of laser beam splitters for changing the expanded pulse laser beam into a plurality of laser beams;

a plurality of mirrors for changing paths of the plurality of laser beams;

a plurality of laser beam scanners for scanning the plurality of laser beams on a target to produce homogeneous diamond plume, wherein each laser beam scanner scans each the laser beam on a predetermined region while each said laser beam scanner moves in parallel from a first portion of the target to a second portion of the target; and a vacuum chamber comprising the target, a substrate holder installed below the target by a predetermined distance and a substrate mounted on the substrate holder, wherein the diamond plume is downward deposited and coated on the substrate to form a diamond film on the substrate.

2. The apparatus for manufacturing a diamond film having a large area according to claim 1, wherein said laser beam scanners further comprise a plurality of focusing lens for focusing the laser beams on the target and for maintaining distances between the target and said laser beam scanners when said laser beam scanners are moved from the first portion of the target and to the second portion of the target, and a plurality of motion controllers for controlling movements of said laser beam scanners.

3. The apparatus for manufacturing a diamond film having a large area according to claim 1, wherein said vacuum chamber further comprises a target holder for holding and rotating the target and an optical window disposed to a side thereof for passing the laser beams thereinto.

4. The apparatus for manufacturing a diamond film having a large area according to claim 1, where the substrate moves in perpendicular direction to a depositing direction of the plumes.

5. A method for manufacturing a diamond film having a large area comprising the steps of:

producing a pulse laser beam from a pulse laser generating system;

expanding a size of the pulse laser beam by using a beam expander to increase a power density of the pulse laser beam;

forming a plurality of laser beams from the pulse laser beam by using a plurality of laser beam splitters;

changing paths of the laser beams by using a plurality of mirrors;

scanning the laser beams to a target is parallel by using a plurality of laser beam scanners;

forming a plurality of plumes from the target by focusing the laser beams on the target while the target rotates; and forming a homogeneous diamond film on a substrate by downward depositing the plumes on on the substrate while the substrate rotates.

* * * * *